(12) United States Patent
Torek et al.

(10) Patent No.: US 6,599,683 B1
(45) Date of Patent: Jul. 29, 2003

(54) PHOTORESIST DEVELOPER WITH REDUCED RESIST TOPPLING AND METHOD OF USING SAME

(75) Inventors: Kevin J. Torek, Meridian, ID (US); Yoshiki Hishiro, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/074,640

(22) Filed: Feb. 13, 2002

(51) Int. Cl.[7] .............................. G03F 7/32; G03F 7/30
(52) U.S. Cl. ..................... 430/326; 430/325; 430/331
(58) Field of Search ........................ 430/325, 331, 430/326

(56) References Cited

U.S. PATENT DOCUMENTS

| | | | | |
|---|---|---|---|---|
| 4,628,023 A | * | 12/1986 | Cawston et al. | 430/331 |
| 4,784,937 A | * | 11/1988 | Tanaka et al. | 430/331 |
| 4,820,621 A | * | 4/1989 | Tanka et al. | 430/331 |
| 4,914,006 A | | 4/1990 | Kato et al. | |
| 5,863,710 A | | 1/1999 | Wakiya et al. | |
| 6,225,030 B1 | | 5/2001 | Tanabe et al. | |
| 6,451,510 B1 | * | 9/2002 | Messick et al. | 430/331 |
| 2002/0187438 A1 | * | 12/2002 | Chang | 430/331 |

* cited by examiner

Primary Examiner—Richard L. Schilling
(74) Attorney, Agent, or Firm—Killworth, Gottman, Hagan & Schaeff, L.L.P.

(57) ABSTRACT

A developer solution used in the development process of a photoresist is provided. The developer solution reduces or eliminates toppling that occurs during development of the photoresist. The solution contains a polyhydric alcohol, a base compound, and a surfactant. A method for developing a photoresist using the solution is provided.

45 Claims, 3 Drawing Sheets

PHOTORESIST DEVELOPER WITH REDUCED RESIST TOPPLING AND METHOD OF USING SAME

BACKGROUND OF THE INVENTION

The present invention relates to a developer solution for a photoresist. More specifically, the present invention relates to a photoresist developer that reduces toppling of the photoresist during later processing and a method of using same.

Photolithographic patterning is a well established technology in the manufacturing processes of various kinds of semiconductor devices and liquid crystal display panels. In this process, prior to etching or diffusion of a substrate surface that surface is electively protected, by coating with a photosensitive resist composition to form a photoresist layer. The photoresist is a light-sensitive liquid that is spread as a uniform thin film on a wafer or substrate. The photoresist layer is pattern-wise exposed to actinic rays such as ultraviolet light, deep ultraviolet light, excimer laser beams, X-rays and electron beams. After the photoresist layer has been exposed to the actinic rays, a developer solution is applied to the resist layer to pattern-wise dissolve away the resist layer. The photoresist material remaining after development shields or masks the regions of the wafer from subsequent etch or implant operations.

The development process of photoresist is performed in order to provide the pattern which will serve as a mask for etching, ion-implantation, lift-off, etc., on the wafer. One of the goals of an effective development process is to minimize pattern distortion. Pattern distortion can be caused by many sources; however, one of the primary sources is surface tension. Surface tension pulls down the walls (i.e., vertical thickness) of the photoresist, also known as toppling, during the rinsing and drying steps of the development process, thereby, destructing the pattern that was originally formed. As shown in FIG. 1, for example, the fine lines used to pattern electrical connections onto a blanket metal are formed by photoresist. When the walls of the photoresist topple, the connections cannot be properly placed onto the blanket metal. Toppling of the photoresist causes much difficulty, is costly as substrates must be scrapped, and time consuming. Accordingly, there is a need for a photoresist developer that will reduce or eliminate the toppling of the photoresist, thereby improving manufacturing efficiency and product yields.

SUMMARY OF THE INVENTION

This need is met by the present invention wherein a developer solution is provided that reduces or eliminates the toppling experienced during photoresist development with prior art compositions. In accordance with one embodiment of the present invention, a photoresist developer solution to reduce toppling is provided. The developer solution comprises from about 80% to about 99% of a polyhydric alcohol, from about 0.1% to about 10% of a base compound, and from about 0.001% to about 1.0% of a surfactant. Water may be added as the balance of the solution. The polyhydric alcohol is selected from the group consisting of propylene glycol and ethylene glycol. The base compound can be any Lewis or Bronstead-Lowry base. Preferably, the base compound is tetramethylammonium hydroxide. The surfactant is selected from the group consisting of anionic, cationic, or nonionic.

In accordance with another embodiment of the present invention, a photoresist developer solution to reduce toppling is provided. The developer solution comprises from about 94% to about 99% of a polyhydric alcohol, from about 0.2% to about 5% of a base compound, and from about 0.001% to about 0.010% of a surfactant. Water may be added as the balance of the solution. The polyhydric alcohol is selected from the group consisting of propylene glycol and ethylene glycol. Typically, the base compound is tetramethylammonium hydroxide. The surfactant is selected from the group consisting of anionic, cationic, or nonionic.

In accordance with yet another embodiment of the present invention, a method of patterning a photoresist having reduced tendency to topple is provided. The method comprises applying a photoresist to a substrate, selectively exposing the photoresist to actinic radiation to form an exposed photoresist, and developing the exposed photoresist with a developer solution to provide a photoresist pattern; wherein the developer solution comprises from about 80% to about 99% of a polyhydric alcohol, from about 0.1% to about 10% of a base compound, and from about 0.001% to about 1.0% of a surfactant. The balance of the solution may be water. The polyhydric alcohol is selected from the group consisting of propylene glycol and ethylene glycol. Typically, the base compound is tetramethylammonium hydroxide. The surfactant is selected from the group consisting of anionic, cationic, or nonionic. The method may also include the steps of rinsing the developed photoresist and drying the developed photoresist.

In accordance with another embodiment of the present invention, a method of patterning a photoresist is provided. The method comprises applying a photoresist to a substrate, selectively exposing the photoresist to actinic radiation to form an exposed photoresist, and developing the exposed photoresist with a developer solution to provide a photoresist pattern; wherein the developer solution comprises from about 94% to about 99% of a polyhydric alcohol, from about 0.2% to about 5% of a base compound, and from about 0.001% to about 0.10% of a surfactant. The balance of the solution may be water. The polyhydric alcohol is selected from the group consisting of propylene glycol and ethylene glycol. Preferably, the base compound is tetramethylammonium hydroxide. The surfactant is selected from the group consisting of anionic, cationic, or nonionic. The method may also include the steps of rinsing the photoresist pattern and drying the photoresist pattern.

Accordingly it is a feature of the present invention to provide a developer solution that will reduce or eliminate toppling of the photoresist. Other features and advantages of the present invention will be apparent in light of the description of the invention embodied herein.

BRIEF DESCRIPTION OF THE SEVERAL VIEWS OF THE DRAWINGS

The following detailed description of the preferred embodiments of the present invention can be best understood when read in conjunction with the following drawings, where like structure is indicated with like reference numerals and in which.

DETAILED DESCRIPTION

Figure 1:
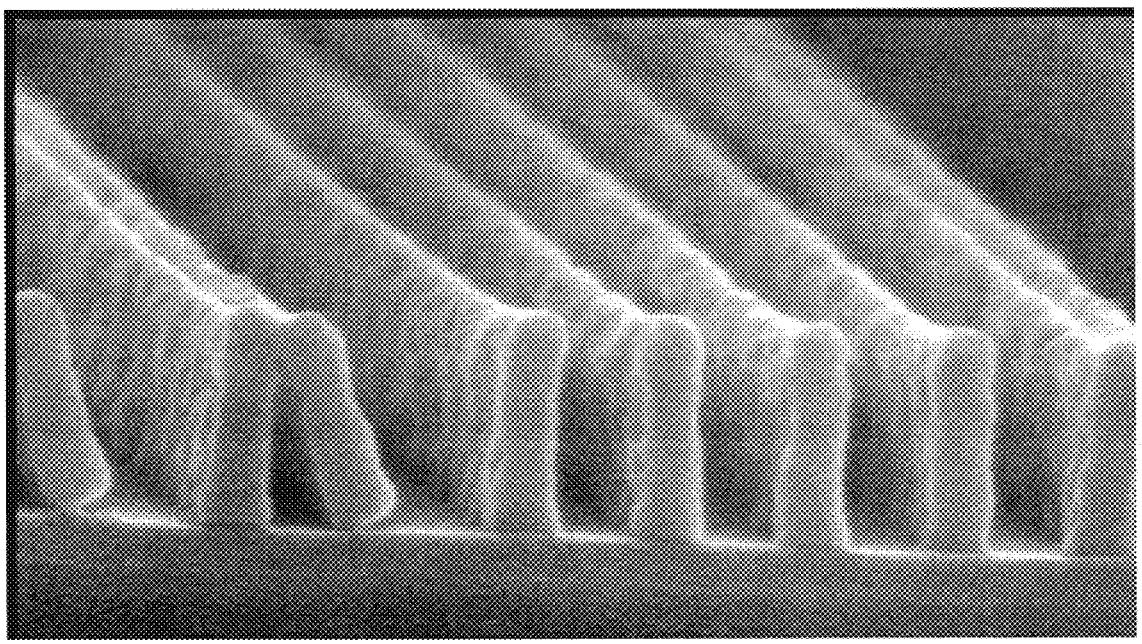
FIG. 1 is a photomicrograph of a toppled photoresist.

The photoresist developer solution of the present invention is a solution that provides a photoresist with a high resistance to toppling.

The developer solution comprises a polyhydric alcohol, a base compound, and a surfactant. The polyhydric alcohol allows development of the photoresist with a reduced surface tension. The polyhydric alcohol used can be any polyhydric alcohol that will reduce the surface tension of the photoresist. Preferably, propylene glycol and ethylene glycol are used in the developer solution. Other polyhydric alcohols such as glycerol, propylene glycol, 1,2-butylene glycol, 1,3-butylene glycol, 2,3-butylene glycol, and combinations thereof can be advantegous to use in the developer solution. The amount of polyhydric alcohol present in the developer solution is in the range of from about 80% to about 99% by weight, preferably from about 94% to about 99% by weight of polyhydric alcohol. When the concentration of polyhydric alcohol falls outside of the lower end of this range, the beneficial effects of the solution to reduce photoresist toppling are curtailed.

The second component of the developer solution is a base compound. The base compound removes the exposed areas of the positive tone resist or removes the unexposed areas of a negative tone resist. Any base compound can be used, however, it is preferable to use tetramethylammonium hydroxide because of its low mobile ion content and low vapor pressure. Other base compounds that may be advantageous to use are tetraethylammonium hydroxide, tetrapropylammonium hydroxide, trimethylethylammonium hydroxide, (2-hydroxyethyl)trimethylammonium hydroxide, (2-hydroxyethyl)triethylammonium hydroxide, (2-hydroxyethyl)tripropylammonium hydroxide and (1-hydroxypropyl)trimethylammonium hydroxide, and combinations thereof. The amount of base used is from about 0.1 to about 10% by weight, preferably from about 0.2 to about 5% by weight of the developer solution. If too much of the base compound is used, developing the photoresist becomes difficult to control.

The third component of the developer solution is a surfactant. The amount of surfactant used is from about 0.001% to about 1.0% by weight, preferably the amount of surfactant used is from about 0.001% to about 0.010% by weight. Typically, the amount of surfactant used in the developer solution is under or at the critical micelle concentration (CMC). The CMC of a surfactant is the characteristic concentration above which the appearance and development of micelles brings about sudden variation in the relation between the concentration and certain physicochemical properties of the solution (such as the surface tension).

The surfactant can be nonionic, anionic, or cationic, but preferably a nonionic surfactant is used. Cationic surfactants that are advangetous to use are Texnol R-5 (available from Nippon Nyukazai K. K.), dodecyltrimethylammonium chloride, Coatamine 24P (trade name of dodecyltrimethylammonium chloride available from Kao Atlas K. K.), hexadecyltrimethylammonium chloride, Coatamine 249 (trademark), dodecylpyridinium cloride, Position BB (trade name of dodecylpicolinium chloride available from Kao Atlas K. K.). Nonionic surfactants that are advangetous to use are Newcol 723 (available from Nippon Nyukazai K. K.), Newcol 569E (available from Nippon Nyukazai K. K.), Newcol 565 (available from Nippon Nyukazai K. K.), and Emalgen A-500. Anionic surfactants that are advangetous to use are sodium dioleylsulfosuccinat, linear alkylbenzene sulfonate, and sodium dodecyl sulfate.

More preferably, the nonionic surfactant Triton X-100 (trademark), commercially available from Union, Carbide is used in the developer solution. The chemical structure of Triton X-100 is believed to be:

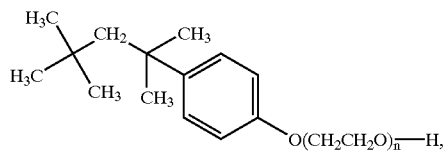

wherein n is from 9–10. Triton X-100 is a stable material with a specific gravity of 1.0623 at 25° C. with a critical micelle concentration of 0.22 to 0.024 mM.

The balance of the solution may be water. However, water is not a necessary component of the developer solution. Optionally, the developer solution may be further mixed with various kinds of known additives such as wetting agents, stabilizers, dissolution aids, and the like each in a limited amount.

Figure 2:
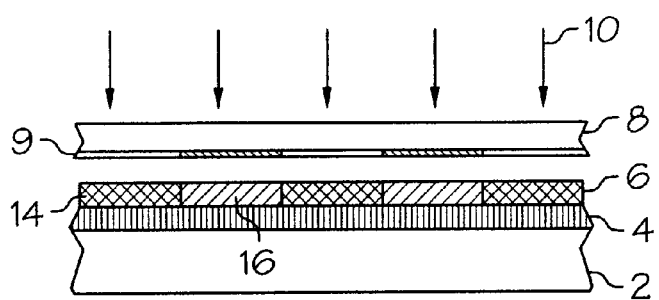
FIG. 2 is a schematic cross-sectional illustration of a layer of photoresist being exposed to a light source through a mask.

Referring to FIG. 2, a surface layer 4 is deposited onto a substrate 2. A typical substrate can be a silicon wafer. A typical surface layer can be a deposited oxide, such as silicon dioxide, nitride, silicon oxynitride, and organic coating materials. A layer of photoresist 6 is placed over the surface layer 4. The novel developer solution is applicable to the development treatment of any photoresist composition including both negative and positive photoresists, such as OFPR-800 (available from Tokoyo Oka K. K) and microposit 1400-27 (available from Shipley Inc.). Particular types of photoresist compositions to which the developer solution is applicable include novolak+diazonaphtoquinone, polyhydroxystryene+photoacid generator (PACT), polymethylmethacrylate+PACT, photo-acid generator type, sensitized type, bis-arylazide type.

A mask 8 is then placed over, but not touching, the layer of photoresist 6. The mask 8 contains clear and/or opaque image 9. A light source 10 is placed over the mask 8. The light source can be any light source that will supply actinic radiation through the mask 8 onto the layer of photoresist 6. A preferred light source is a halogen laser. The image 9 on the mask 8 allows the actinic radiation from the light source 10 to pass only to certain sections of the layer of photoresist 6. Thus, a replicate of the image 9 is created on the layer of photoresist 6. Therefore, the layer of photoresist 6 has areas that are exposed to the light source 10 and areas that are not exposed to the light source 10. The exposed areas 14 and nonexposed areas 16 of the layer of photoresist 6 can be rendered soluble or insoluble depending on the type of photoresist used. If a negative photoresist is used, the exposed areas 14 of the layer of photoresist 6 are rendered insoluble while the nonexposed areas 16 are rendered soluable. If a positive photoresist is used, the exposed areas 14 are rendered soluble and the nonexposed areas 16 are rendered insoluable.

A developer solution is then applied to the layer of photoresist 6. The developer solution can be applied using in any of the primary methods of development for photoresists. There are three primary methods of development for the photoresist: immersion developing, spray development, and puddle developing. With immersion developing, the substrates are batch-immersed and agitated in a bath of the developer at a desired temperature and for a specific time. For the immersion process, the substrate is typically a semiconductor wafer that is round with a 1–12 inches diameter and about 1 mm thick or less. In spray development, the developer solution is directed across the substrates surfaces by a fan-type spray. A controlled amount of the developer solution is drained off and an equivalent amount of fresh developer solution is added. Spray development can be carried out in a batch or by a single-wafer. With a single-substrate spray development process, the developer is sprayed onto a wafer and is spinning. The wafer is then spun-dry. With the puddle method, a fixed amount of developer is dispensed onto a static substrate.

Figure 3:
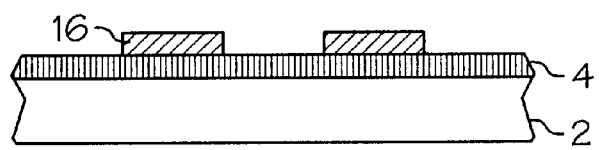
FIG. 3 is a schematic cross-sectional illustration of a negative photoresist layer.
Figure 4:
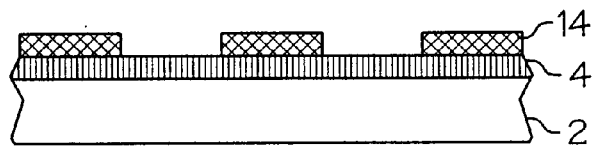
FIG. 4 is a schematic cross-sectional illustration of a positive photoresist layer

If a negative photoresist was used, as shown in FIG. 3, the nonexposed areas 16 of the layer of photoresist 6 are dissolved by the developer solution, thus creating a negative image of the mask 8. If a positive photoresist was used, as shown in FIG. 4, the nonexposed areas 16 of the layer of photoresist 6 are not dissolved by the developer solution. Rather the exposed areas 14 that are rendered soluable by the actinic radiation of the light source 10 are dissolved, thereby creating a positive image of the mask 8. Positive photoresists present a different developing condition. During the developing step some resist is lost from the polyrnerized region. The use of developers result in an unacceptable thinning of the resist film, which may cause toppling during other steps, i.e. the etching step. Typically, two types of chemical developers are used with positive resists, alkaline-water solutions and nonionic solutions. The alkaline-water solutions can be sodium hydroxide or potassium hydroxide. Most positive resist fabrication lines use a nonionic solution of tetramethylammonium.

After the developer solution is applied, it is left on the layer of photoresist 6 for approximately one second to five minutes, depending upon the developing needs of the layer of photoresist 6. The developer solution is then rinsed off by a rinse liquid, typically for 30 seconds to 90 seconds. The rinse liquid can be n-butyl acetate because it neither swells nor contracts the resist. However, mixtures of alcohol and trichloroethylene can serve as a rinse for a negative resist. Water can also be used as a rinse. The rinse rapidly dilutes the developer chemical so that the developing action will stop. The rinse also removes partially polymerized pieces of resist from the open regions in the resist film. Typically, the rinse chemical for positive photoresist developers is water.

After the developer solution has been rinsed and the photoresist is dried, the substrate is typically baked to evaporate the solvents and harden the photoresist. This step is not always needed. The primary goal of this step is to achieve good adhesion of the photoresist to the substrate. After being baked, the photoresist is inspected for any imperfections.

The developer solution of the present invention is described in more detail by way of the following example which is intended to be illustrative of the invention, but not intended to be limiting in scope.

EXAMPLE

Figure 5:
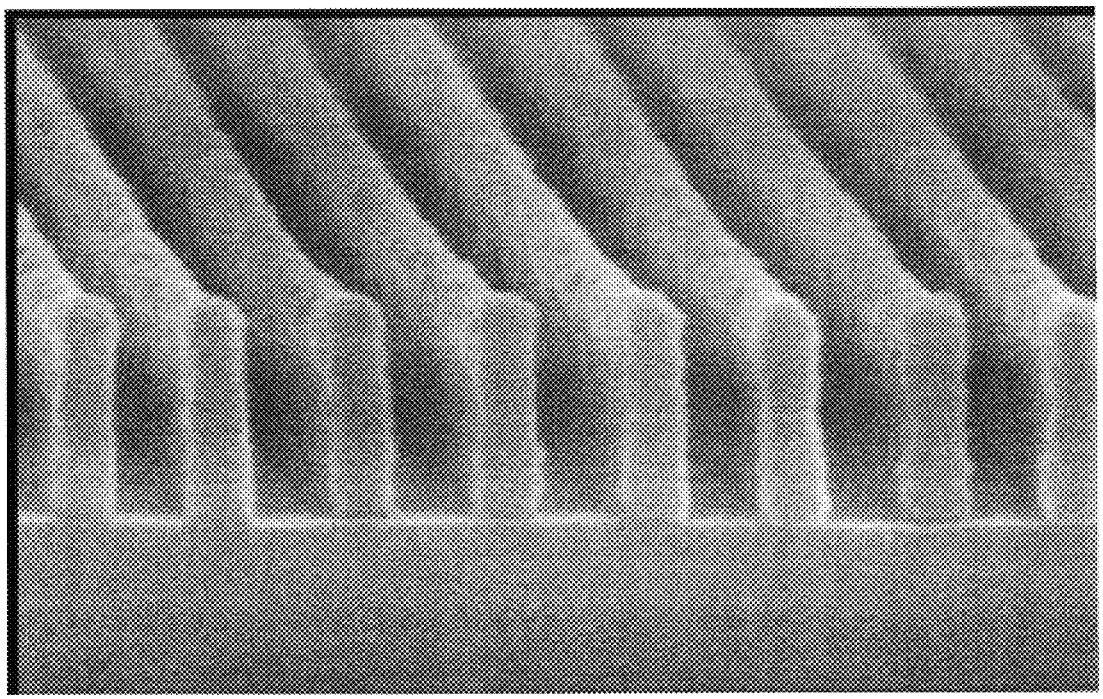
FIG. 5 is a photomicrograph of a patterned photoresist with no toppling.

The photoresist developer solution used to produce the photoresist walls shown in FIG. 5 was applied by hand pouring the developer solution onto the photoresist. The photoresist used was a PAR 718 (available from Sumitomo Chemical Co. Ltd.) which is a positive resist that can be used with a 193 nm light, also known as a "deep LTV" resist. The developer solution was at room temperature. The developer solution comprised 1 part Triton X- 100 per 20,0000 parts of the developer mixture; about 50 ppm (about 0.005 wt. %); 30 ml of 25 wt. % tetramethylammonium hydroxide in 550 ml of propylene glycol, which is about 7.5 g of tetramethylammonium hydroxide; and 550 g of propylene glycol with equal about 1.3 wt % of tetramethylammonium hydroxide (about 0.138 N). The photoresist had less than 12 hours between exposure and development. The developer remained on the photoresist for about 30 seconds. The photoresist was rinsed for 20–60 seconds with deionized water at 30° C. The wafer was spinning during the development and rinsing process. The line/space of the photoresist was 110 nm, which is an organic bottom antireflective coating (BARC). The coating thickness of the photoresist was 400 nm. The photoresist was on AR 19.

Having described the invention in detail and by reference to preferred embodiments thereof, it will be apparent that modifications and variations are possible without departing from the scope of the invention defined in the appended claims. More specifically, although some aspects of the present invention are identified herein as preferred or particularly advantageous, it is contemplated that the present invention is not necessarily limited to these preferred aspects of the invention.

What is claimed is:

1. A photoresist developer solution to reduce toppling comprising:
   from about 80% to about 99% of a polyhydric alcohol;
   from about 0.1% to about 10% of a base compound; and
   from about 0.001% to about 1.0% of a surfactant.

2. A photoresist developer as claimed in claim 1 wherein said polyhydric alcohol is propylene glycol or ethylene glycol.

3. A photoresist developer as claimed in claim 1 wherein said surfactant is selected from the group consisting of anionic, cationic, or nonionic surfactants.

4. A photoresist developer as claimed in claim 1 wherein said base compound is tetramethylammonium hydroxide.

5. A photoresist developer solution to reduce toppling comprising:
   from about 80% to about 99% of a polyhydric alcohol;
   from about 0.1% to about 10% of a base compound; and
   from about 0.001% to about 1.0% of a surfactant;
   wherein the balance is water.

6. A photoresist developer as claimed in claim 5 wherein said polyhydric alcohol is propylene glycol or ethylene glycol.

7. A photoresist developer as claimed in claim 5 wherein said surfactant is selected from the group consisting of anionic, cationic, or nonionic surfactants.

8. A photoresist developer as claimed in claim 5 wherein said base compound is tetramethylammonium hydroxide.

9. A photoresist developer solution to reduce toppling comprising:
   from about 94% to about 99% of a polyhydric alcohol;
   from about 0.2% to about 5% of a base compound; and
   from about 0.001% to about 0.10% of a surfactant.

10. A photoresist developer as claimed in claim 9 wherein said polyhydric alcohol is propylene glycol or ethylene glycol.

11. A photoresist developer as claimed in claim 9 wherein said surfactant is selected from the group consisting of anionic, cationic, or nonionic surfactants.

12. A photoresist developer as claimed in claim 9 wherein said base compound is tetramethylammonium hydroxide.

13. A photoresist developer solution to reduce toppling comprising:
   from about 94% to about 99% of a polyhydric alcohol;
   from about 0.2% to about 5% of a base compound; and
   from about 0.001% to about 0.10% of a surfactant;
   wherein the balance is water.

14. A photoresist developer as claimed in claim 13 wherein said polyhydric alcohol is propylene glycol or ethylene glycol.

15. A photoresist developer as claimed in claim 13 wherein said surfactant is selected from the group consisting of anionic, cationic, or nonionic surfactants.

16. A photoresist developer as claimed in claim 13 wherein said base compound is tetramethylammonium hydroxide.

17. A photoresist developer solution comprising:
   from about 80% to about 99% of a polyhydric alcohol;
   from about 0.1% to about 10% of a base compound; and
   a sufficient amount of a surfactant to lower the surface tension of the photoresist and reduce toppling.

18. A photoresist developer solution comprising:
   from about 80% to about 99% of a polyhydric alcohol;
   from about 0.1% to about 10% of a base compound; and
   a sufficient amount of a surfactant to lower the surface tension of the photoresist and reduce toppling;
   wherein the balance is water.

19. A photoresist developer solution comprising:
   from about 94% to about 99% of a polyhydric alcohol;
   from about 0.2% to about 5% of a base compound; and
   a sufficient amount of a surfactant to lower the tension of the photoresist and reduce toppling.

20. A photoresist developer solution to reduce toppling comprising:
   from about 94% to about 99% of a polyhydric alcohol;
   from about 0.2% to about 5% of a base compound; and
   a sufficient amount of a surfactant to lower the tension of the photoresist and reduce toppling; wherein the balance is water.

21. A photoresist developer solution to reduce toppling comprising:
   from about 80% to about 99% of a propylene glycol;
   from about 0.1% to about 10% of tetramethylammonium hydroxide; and
   from about 0.001% to about 1.0% of a nonionic surfactant.

22. A photoresist developer solution to reduce toppling comprising:
   from about 80% to about 99% of a propylene glycol;
   from about 0.1% to about 10% of tetramethylammonium hydroxide; and
   from about 0.001% to about 1.0% of a nonionic surfactant;
   wherein the balance is water.

23. A photoresist developer solution to reduce toppling comprising:
   from about 94% to about 99% of a propylene glycol;
   from about 0.2% to about 5% of tetramethylammonium hydroxide; and
   from about 0.001% to about 0.10% of a nonionic surfactant.

24. A photoresist developer solution to reduce toppling comprising:
   from about 94% to about 99% of a propylene glycol;
   from about 0.2% to about 5% of tetramethylammonium hydroxide; and
   from about 0.001% to about 0.10% of a nonionic surfactant;
   wherein the balance is water.

25. A photoresist developer solution to reduce toppling comprising:
   from about 80% to about 99% of a propylene glycol;
   from about 0.1% to about 10% of tetramethylammonium hydroxide; and
   from about 0.001% to about 0.10% of a surfactant with the chemical structure

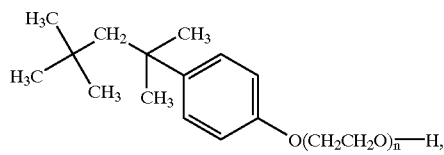

wherein n is 9–10.

26. A photoresist developer solution to reduce toppling comprising:
   from about 80% to about 99% of a propylene glycol;
   from about 0.1% to about 10% of tetramethylammonium hydroxide; and
   from about 0.001% to about 0.10% of a surfactant with the chemical structure

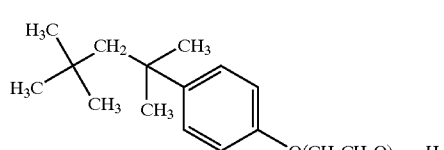

wherein n is 9–10;
wherein the balance is water.

27. A photoresist developer solution to reduce toppling comprising:
   from about 94% to about 99% of a propylene glycol;
   from about 0.2% to about 5% of tetramethylammonium hydroxide; and
   from about 0.001% to about 0.10% of a surfactant with the chemical structure

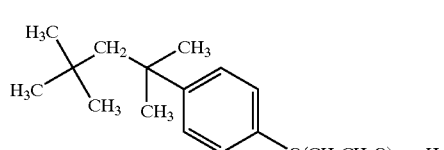

wherein n is 9–10.

28. A photoresist developer solution to reduce toppling comprising:
   from about 94% to about 99% of a propylene glycol;
   from about 0.2% to about 5% of tetramethylammonium hydroxide; and
   from about 0.001% to about 0–10% of a surfactant with the chemical structure

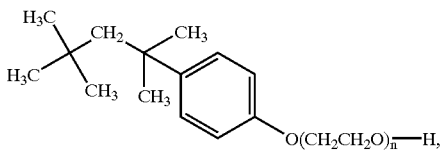

wherein n is 9–10;

wherein the balance is water.

29. A method of patterning a photoresist having reduced toppling comprising:

applying a photoresist to a substrate;

selectively exposing said photoresist to actinic radiation to form an exposed photoresist; and developing said exposed photoresist with a developer solution to provide a photoresist pattern; wherein said developer solution comprises from about 80% to about 99% of a polyhydric alcohol, from about 0.1% to about 10% of a base compound, and from about 0.001% to about 1.0% of a surfactant.

30. A method of patterning a photoresist comprising:

applying a photoresist to a substrate;

selectively exposing said photoresist to actinic radiation to form an exposed photoresist; and developing said exposed photoresist with a developer solution to provide a photoresist pattern; wherein said developer solution comprises from about 80% to about 99% of a polyhydric alcohol, from about 0.1% to about 10% of a base compound, and from about 0.001% to about 1.0% of a surfactant, wherein the balance is water.

31. A method of patterning a photoresist comprising:

applying a photoresist to a substrate;

selectively exposing said photoresist to actinic radiation to form an exposed photoresist; and developing said exposed photoresist with a developer solution to provide a photoresist pattern; wherein said developer solution comprises from about 94% to about 99% of a polyhydric alcohol, from about 0.2% to about 5% of a base compound, and from about 0.001% to about 0.10% of a surfactant.

32. A method of patterning a photoresist comprising:

applying a photoresist to a substrate;

selectively exposing said photoresist to actinic radiation to form an exposed photoresist; and developing said exposed photoresist with a developer solution to provide a photoresist pattern; wherein said developer solution comprises from about 94% to about 99% of a polyhydric alcohol, from about 0.2% to about 5% of a base compound, and from about 0.001% to about 0.10% of a surfactant, wherein the balance is water.

33. A method of patterning a photoresist comprising:

applying a photoresist to a substrate;

selectively exposing said photoresist to actinic radiation to form an exposed photoresist; and developing said exposed photoresist to provide a photoresist pattern; wherein said developer solution comprises from about 80% to about 99% of a propylene glycol, from about 0.1% to about 10% of tetramethylammonium hydroxide, and from about 0.001% to about 1.0% of nonionic surfactant.

34. A method of patterning a photoresist comprising:

applying a photoresist to a substrate;

selectively exposing said photoresist to actinic radiation to form an exposed photoresist; and developing said exposed photoresist with a developer to provide a photoresist pattern;

wherein said developer solution comprises from about 80% to about 99% of a propylene glycol, from about 0.1% to about 10% of tetramethylammonium hydroxide, and from about 0.001% to about 1.0% of a nonionic surfactant, wherein the balance is water.

35. A method of patterning a photoresist comprising:

applying a photoresist to a substrate;

selectively exposing said photoresist to actinic radiation to form an exposed photoresist; and developing said exposed photoresist with a developer to provide a photoresist pattern;

wherein said developer solution comprises from about 94% to about 99% of a propylene glycol, from about 0.2% to about 5% of tetramethylammonium hydroxide, and from about 0.001% to about 0.10% of a nonionic surfactant.

36. A method of patterning a photoresist comprising:

applying a photoresist to a substrate;

selectively exposing said photoresist to actinic radiation to form an exposed photoresist;

developing said exposed photoresist with a developer to provide a photoresist pattern;

wherein said developer solution comprises from about 94% to about 99% of a propylene glycol, from about 0.2% to about 5% of tetramethylammonium hydroxide, and from about 0.001% to about 0.1 0% of a nonionic surfactant, wherein the balance is water; and rinsing said photoresist pattern; and drying said photoresist pattern.

37. A method of patterning a photoresist comprising:

applying a photoresist to a substrate;

selectively exposing said photoresist to actinic radiation to form an exposed photoresist; and developing said exposed photoresist with a developer to provide a photoresist pattern; wherein said developer solution comprises from about 80% to about 99% of a propylene glycol, from about 0.1% to about 10% of tetramethylammonium hydroxide, and from about 0.001% to about 0–10% of a surfactant having the chemical structure

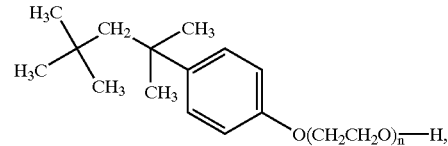

wherein n is 9–10.

38. A method of patterning a photoresist comprising:

applying a photoresist to a substrate;

selectively exposing said photoresist to actinic radiation to form an exposed photoresist;

developing said exposed photoresist with a developer to provide a photoresist pattern; wherein said developer solution comprises from about 80% to about 99% of a propylene glycol, from about 0.1% to about 10% of tetramethylammonium hydroxide, and from about 0.001% to about 0.10% of a surfactant having the chemical structure

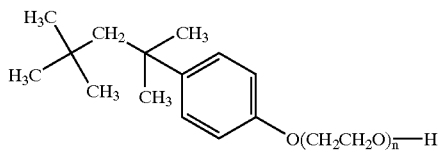

wherein n is 9–10;
wherein the balance is water;
rinsing said photoresist pattern; and
drying said photoresist pattern.

39. A method of patterning a photoresist comprising:
applying a photoresist to a substrate;
selectively exposing said photoresist to actinic radiation to form an exposed photoresist; and developing said exposed photoresist with a developer to provide a photoresist pattern; wherein said developer solution comprises from about 94% to about 99% of a propylene glycol, from about 0.2% to about 5% of tetramethylammonium hydroxide, and from about 0.001% to about 0.10% of a surfactant having the chemical structure

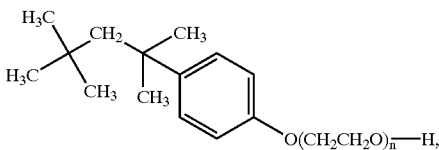

wherein n is 9–10.

40. A method of patterning a photoresist comprising:
applying a photoresist to a substrate;
selectively exposing said photoresist to actinic radiation to form an exposed photoresist;
developing said exposed photoresist with a developer to provide a photoresist pattern; wherein said developer solution comprises from about 94% to about 99% of a propylene glycol, from about 0.2% to about 5% of tetramethylammonium hydroxide, and from about 0.001% to about 0.10% of a surfactant having the chemical structure

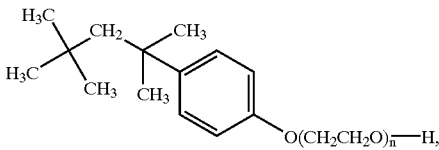

wherein n is 9–10;
wherein the balance is water,
rinsing said photoresist pattern; and
drying said photoresist pattern.

41. A method of patterning a photoresist comprising:
applying a photoresist to a substrate;
selectively exposing said photoresist to actinic radiation to form an exposed photoresist;
developing said exposed photoresist to provide a photoresist pattern with a developer comprising from about 80% to about 99% polyhydric alcohol, wherein said developer acts on said photoresist to lower surface tension sufficiently to reduce toppling; and
rinsing said photoresist pattern with a rinse that does not contain an anionic surfactant.

42. A method of patterning a photoresist comprising:
applying a photoresist to a substrate;
selectively exposing said photoresist to actinic radiation to form an exposed photoresist;
developing said exposed photoresist to provide a photoresist pattern with a developer comprising from about 80% to about 99% polyhydric alcohol, wherein said developer acts on said photoresist to lower surface tension sufficiently to reduce toppling; and
rinsing said photoresist pattern with a rinse selected from n-butyl acetate, a mixture of alcohol and trichloroethylene, or water; and
drying said photoresist pattern.

43. A method of patterning a photoresist comprising:
applying a photoresist to a substrate;
selectively exposing said photoresist to actinic radiation to form an exposed photoresist; and
developing said exposed photoresist with a developer solution to provide a photoresist pattern; wherein said developer solution comprises from about 80% to about 99% of a polyhydric alcohol, from about 0.1% to about 10% of a base compound, and from about 0.001% to about 1.0% of a surfactant that acts on said photoresist to lower surface tension sufficiently to reduce toppling, wherein the balance is water.

44. A method of patterning a photoresist comprising:
applying a photoresist to a substrate;
selectively exposing said photoresist to actinic radiation to form an exposed photoresist; and
developing said exposed photoresist with a developer solution to provide a photoresist pattern; wherein said developer solution comprises from about 94% to about 99% of a polyhydric alcohol, from about 0.2% to about 5% of a base compound, and from about 0.001% to about 0.10% of a surfactant that acts on said photoresist to lower surface tension sufficient to reduce toppling, wherein the balance is water.

45. A method of patterning a photoresist comprising:
applying a photoresist to a substrate;
selectively exposing said photoresist to actinic radiation to form an exposed photoresist;
developing said exposed photoresist with a developer to provide a photoresist pattern;
wherein said developer solution comprises from about 94% to about 99% of a propylene glycol, from about 0.2% to about 5% of tetramethylammonium hydroxide, and from about 0.001% to about 0.10% of a surfactant that acts on said photoresist to lower surface tension sufficiently to reduce toppling;
rinsing said photoresist pattern; and
drying said photoresist pattern.

* * * * *

UNITED STATES PATENT AND TRADEMARK OFFICE
CERTIFICATE OF CORRECTION

PATENT NO. : 6,599,683 B1
DATED : July 29, 2003
INVENTOR(S) : Kevin J. Torek and Yoshiki Hishiro It is certified that error appears in the above-identified patent and that said Letters Patent is hereby corrected as shown below:

Column 5,
Line 20, "the polyrnerized region" should be -- the polymerized region --;
Line 60, "a "deep LTV" resist." should be -- a "deep UV" resist. --;

Column 8,
Line 66, "about 0-10% of a surfactant" should be -- about 0.10% of a surfactant --;

Column 10,
Line 48, "about 0-10% of a surfactant" should be -- about 0.10% of a surfactant --.

Signed and Sealed this

Eighteenth Day of November, 2003

JAMES E. ROGAN
*Director of the United States Patent and Trademark Office*